United States Patent [19]

Clabes et al.

[11] Patent Number: 4,886,681
[45] Date of Patent: Dec. 12, 1989

[54] METAL-POLYMER ADHESION BY LOW ENERGY BOMBARDMENT

[75] Inventors: Joachim G. Clabes, Yorktown Heights, N.Y.; Peter O. Hahn, Burghausen, Fed. Rep. of Germany; Paul S. Ho, Chappaqua, N.Y.; Haralambos Lefakis, San Jose, Calif.; Gary W. Rubloff, Katonah, N.Y.

[73] Assignee: International Business Machines Corporation, Armonk, N.Y.

[21] Appl. No.: 281,960

[22] Filed: Dec. 6, 1988

Related U.S. Application Data

[63] Continuation of Ser. No. 6,263, Jan. 20, 1987, abandoned, which is a continuation of Ser. No. 746,908, Jun. 20, 1985, abandoned.

[51] Int. Cl.$^4$ ............................................... B05D 3/06
[52] U.S. Cl. .................................. 427/38; 204/192.1; 427/35; 427/250
[58] Field of Search ........................... 427/35, 38, 250; 204/192.1

[56] References Cited

U.S. PATENT DOCUMENTS

| | | | |
|---|---|---|---|
| 4,165,394 | 8/1979 | Ehrbar et al. | 427/40 |
| 4,250,225 | 2/1981 | Shirahata et al. | 427/129 X |
| 4,560,577 | 12/1985 | Mirtich et al. | 427/38 |

Primary Examiner—Bernard Pianalto
Attorney, Agent, or Firm—Jackson E. Stanland

[57] ABSTRACT

A technique is described for improving metal-organic substrate adhesion and for reducing stress between the metal film and the substrate. Low energy reactive ions, electrons, or photons are incident upon the substrate to alter the surface chemistry of the substrate to a depth of from about 10 angstroms to a few hundred angstroms. The energy of the incident reactive ions and electrons is about 50–2000 eV, while the energy of the incident photons is about 0.2–500 eV. Irradiation of the substrate can occur prior to or during metal deposition. For simultaneous metal deposition/particle irradiation, the arrival rates of the metal atoms and the substrate treatment particles are within a few order of magnitude of one another. Room temperatures or elevated temperatures are suitable.

15 Claims, 1 Drawing Sheet

METAL-POLYMER ADHESION BY LOW ENERGY BOMBARDMENT

This application is a continuation of U.S. Pat. No. 07/006,263 filed 1/20/87 which is a continuation of U.S. Pat. No. 06/746,908 filed 6/20/85 both are now abandoned.

DESCRIPTION

1. Field of the Invention

This invention relates to a technique for improving metal-polymer adhesion and reducing stress in a deposited metal film, wherein low energy bombardment of the polymer is used to enhance adhesion, and more particularly to such a technique in which low energy reactive ions, electrons, or photons are used to alter the surface chemistry of the polymer to a shallow depth in order to enhance adhesion.

2. Background Art

The metallization of organic substrates, such as plastic materials, is becoming increasingly important, especially in the electronics field. Most packaging approaches require metallization to be applied to organic (polymer) substrates such as, for example, copper on polyimide. In the prior art, copper has been deposited by a number of techniques, including plating, vacuum evaporation, and sputtering. Often, chemical conditioning of the substrate surface is utilized prior to deposition in order to have better adherence of the metal film to the substrate. However, the problem of poor adhesion between the metal and the organic substrate is still the major problem to overcome.

Many approaches have been tried in the art to enhance adhesion between metal films and organic substrates, with varying degrees of success. In some situations, metals are matched with particular resinous substrates where it has been determined that adherence therebetween is superior to other metal-substrate combinations. Still other situations use extensive pre-cleaning of the substrates prior to metal deposition in order to remove contaminants and roughen the substrate surface. In many of these methods, expensive and/or toxic chemical elements are employed, which is a further disadvantage.

Other techniques utilize glow discharges or plasma discharges to affect the polymer surface prior to metal deposition. Examples of the use of a glow discharge to enhance adhesion are found in U.S. Pat. Nos. 4,165,394 and 4,250,225. This type of technique is also described by L. R. Yetter in IBM Technical Disclosure Bulletin, Vol. 16, No. 7, page 2045, Dec. 1973. In glow discharge techniques, a brush or glow discharge is created by introducing residual gasses into a vacuum chamber and applying a high voltage in order to create ions which activate the polymer substrate surface. Examples of the gasses which can be introduced into the vacuum chamber include air, oxygen, nitrogen, helium, neon, argon, krypton, xenon, and radon. After the glow discharge activation, the metal film is deposited by techniques such as electroless plating, evaporation, and sputtering.

Another technique for enhancing adhesion between metal films and organic substrates is plasma treatment of the substrates. This technique is very similar to the aforementioned glow discharge technique and is described in, for example, U.S. Pat. Nos. 4,337,279 and 4,382,101. It is also described in an abstract of Japanese patent J55099932. In this technique, the organic substrate is placed in a plasma reactor, where the plasma is produced by the introduction of a gas such as helium, argon, $CF_4$, $C_3F_8$, $C_4F_8$, $CHF_3$, carbon fluoride, nitrogen, oxygen, etc.. Plasma treatment of the substrate occurs for varying periods of time measured from minutes to several hours.

Another treatment process for enhancing metal-organic substrate deposition is the use of high energy ion beams. Examples of this technique are described by J. E. Griffith et al, Nuc. Instr. and Methods, 198, 608 (1982) and in papers presented by J. Baglin et al at the Materials Research Society Meeting, Boston, MA, Nov. 14-17, 1983. In ion beam enhanced adhesion, a high energy beam of ions is incident upon the organic substrate prior to deposition of a metal layer. For example, copper can be deposited on polymer substrates by electron beam deposition, after high energy ion irradiation of the substrates. In this procedure, both reactive and inactive ions can be used, and the ion beam energy ranges upward from about 200 keV.

While some degree of success has been recorded for these techniques to enhance adhesion, each such technique is not without difficulties. For example, plasma and glow discharge techniques offer very poor control of ion energy and current, ambient gas pressure, substrate temperature, etc. Also, it is very difficult to obtain good control of the energy beam flux in plasma and glow discharge systems. These systems require high pressures, of the order of 1 torr. which corresponds to $1 \times 10^{21}$ gas atoms/$cm^2$-sec., in order to maintain the discharge. These rates dominate all other rates in the system. These rates also cannot be readily matched with metal evaporation rates, and evaporation cannot be carried out at such high pressures. This in turn means that metal deposition has to be by plasma sputtering, rather than any other technique. Further, in plasma and glow discharge systems, there is very poor control over the incident ion beam direction as the ions strike the substrate surface. It is also the situation that the purity of residual gas control in such systems is not well controlled and is often sufficiently high that contamination can easily occur.

High energy ion beam enhancement of adhesion is also not without problems. Such systems are costly and require complicated apparatus to produce the high energy, focussed ion beam. The nature of the ion beam makes it impossible to be able to process large substrate areas simultaneously, and therefore this technique is not readily suitable for high throughput in commercial systems. Further, high energy ion beams can cause damage to the organic substrate and require large amounts of power. It is also extremely difficult to make large, high energy ion beams with the proper flux and power over a large area.

Wet processing steps, such as chemical steps, are also difficult to control and often require toxic or otherwise offensive solutions. When chemical cleaning is used, there is always a later exposure of the substrates to the environment, and therefore possible contamination can occur. In general, it is preferable to have a completely dry processing system for both surface preparation and metal deposition.

Accordingly, it is a primary object of this invention to provide a simple technique for improving metal-organic substrate adhesion, which is suitable for use in commercial manufacturing processes.

It is another object of this invention to provide improved metal-organic substrate adhesion at low cost and high reliability.

It is another object of the present invention to provide an improved technique for enhancing the peel strength of metals on organic substrates.

It is another object of this invention to provide a dry processing technique for simply and rapidly enhancing the adhesion between metals and organic substrates.

It is a further object of this invention to provide an improved technique for enhancing metal-organic substrate adhesion, where the method can be used to process large areas of the substrate.

It is a still further object of this invention to provide an improved technique for enhancing metal-substrate adhesion, which technique will also reduce stress between the metal and the organic substrate.

It is another object of this invention to provide an improved technique for enhancing metal-organic substrate adhesion, where the technique is suitable for use with many types of metals and organic substrates, including the most commonly used metals and substrates.

It is another object of this invention to provide a simplified technique for enhancing metal-organic substrate adhesion, where the technique is readily controllable and can be used to optimize adhesion.

It is another object of this invention to provide a technique for improving metal-organic substrate adhesion, wherein dry processing with low energy particles is utilized, and wherein the apparatus for providing the particles is simple and of low cost.

It is another object of the present invention to provide a simplified technique for enhancing metal-organic substrate adhesion, where the possibility of contamination by other substances is minimized.

DISCLOSURE OF INVENTION

This technique for enhancing metal-organic substrate adhesion uses low energy reactive ion, electron, or photon irradiation of the organic substrate in order to alter the surface chemistry of the substrate to a depth from about 10 angstroms to a few hundred angstroms, so that enhanced adhesion between the metal and the substrate will occur. The energy of the radiation particles is about 50–2000 eV and preferrably about 200–500 eV. In this technique, the dominant mechanism for adhesion is an alteration of the surface chemistry of the substrate, rather than a rearrangement of the surface atoms and molecules. For this reason, it is distinguished from the high energy ion beam techniques described hereinabove, which physically alter the atomic arrangement in the surface of the substrate. In further distinction with the high ion beam energy techniques of the prior art, the present invention requires reactive ions and will not work with inert ions. Such inert ions do not chemically alter the surface of the substrate, and are inappropriate for use in the present invention. Still further, the present invention can use electrons and photons as incident particles. Since these particles have negligible mass, momentum transfer is not the dominant mechanism for the changes which occur; instead these particles are used to alter the surface chemistry. This further distinguishes the present technique from the prior art high energy ion bombardment techniques wherein momentum transfer is a dominant mechanism.

In the practice of this invention, the low energy particle irradiation can occur prior to metal deposition, or simultaneously with metal deposition. If particle irradiation occurs simultaneously with metal deposition, the arrival rates of the metal atoms and the particles are adjusted to be comparable, at least within about 2 orders of magnitude of each other. Only by controlled energy beam irradiation can the relative impingement rate of the energy beam and the metal atoms be provided with significant dynamic range to achieve optimum adhesion. This feature further distinguishes the aforementioned prior art glow discharge and plasma techniques for enhancing adhesion.

Many types of metals can be deposited on the organic substrates including, for example, Ni, Cu, Ti, Cr, Al, Mo, W, Rh, Pt, Pd, etc.. The substrates are organic materials including plastics, polyimide, polyesters, Teflon (a trademark of E.I. duPont deNemours), Mylar (also a trademark of E.I. duPont deNemours), epoxies, etc.. Typically, the substrates are organic polymers. The reactive ion species which can be used include many different ions, such as F, Cl, S, O, N, $CF_4$, $CCl_4$, CO, H, etc..

Substrate irradiation and metal deposition can occur over a range of temperatures, including room temperature and elevated temperatures. Commercially available ion sources can be used to provide low energy ion beams, and the metal deposition step is also a dry processing step, such as sputtering or evaporation.

These and other objects, features, and advantages will be apparant from the following more particular description of the preferred embodiments.

BEST MODE FOR CARRYING OUT THE INVENTION

Figure 1:
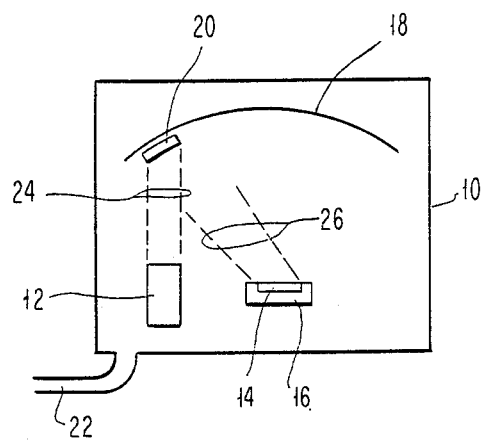
FIG. 1 schematically illustrates an apparatus for carrying out the present invention.

In this invention, low energy beams are used to alter the surface chemistry of a thin layer at the surface of the organic substrate onto which metal is to be deposited. The particles which can be used to irradiate the organic substrate are reactive ions, electrons, and photons, having energies in the appropriate range. For example, the reactive ions and electrons can have energies in the range 50–2000 eV, with preferred particle energies being in the range 200–500 eV. The energy range suitable for photons is about 0.2 eV to 500 eV, with the preferred range being 0.5 to 10 eV. Infrared radiation will provide photons having energies of about 0.2 eV and greater, while ultraviolet radiation will provide photons having energies of about 2–10 eV. In the practice of this invention, the surface chemistry of the organic substrate is modified to a depth up to a few hundred angstroms, and in particular about 10–300 angstroms. Low energy particle irradiation of the substrate can occur prior to or during metal deposition.

During the low energy particle bombardment, chemical bonds in the organic substrate are broken and altered and/or the surface of the substrate is heated. Parameters important for adhesion, such as the rate of metal deposition, are closely correlated to the rate of arrival of the low energy particles in order to adjust the relative impingement rates to achieve optimum adhesion. The dominant mechanism for enhancing adhesion is a chemical one in which the chemical activity of the surface layer of the substrate is altered by the low energy particle irradiation. Any physical rearrangement of atoms and molecules in the substrate occurs only to a very small degree, and is not a significant mechanism in producing enhanced adhesion.

It is the initial deposition of the metal onto the substrate which is important for adhesion. Once approximately 300 angstroms of continuous metal film are formed on the surface of the substrate, the metal deposition rates can be increased without affecting metal-substrate adhesion. Typically, the metal is initially deposited at rates of from 1-100 angstroms/sec., corresponding to $10^{15}$–$10^{17}$ atoms/$cm^2$-sec.. The particle fluxes of the incident reactive ions, electrons, or photons in the radiation beam are of this order to provide enhanced metal-substrate adhesion.

Particle irradiation can occur at room temperature, or at elevated substrate temperatures. For significantly enhanced metal-substrate adhesion, the teachings of copending application Ser. No. 690,567, filed Jan. 11, 1985 and assigned to the present assignee, can be incorporated to provide optimum substrate temperatures. Further, the angle of incidence of the low energy particles is not critical, except that very shallow grazing angles (less than about 10°–20°) will not have a significant effect on the chemistry of the surface layer of the substrate within reasonable periods of time. For angles with incidence greater than grazing angles, and especially with the common practice of using near normal incidence, substrate irradiation with low energy reactive ions, electrons, or photons can occur over time periods ranging from minutes to several hours in order to chemically activate the substrate.

At least two modes of operation can be undertaken. In the first, the substrate surface is irradiated with reactive ions, electrons, or photons to alter the surface chemistry in the substrate. After irradiation with these low energy particles for a sufficient period of time to provide surface chemistry alteration to a depth in the substrate of about 300 angstroms or less, the irradiation is stopped. After this, the metal film is deposited using a dry process such as evaporation or sputtering. Deposition of the metal can occur in the same vacuum chamber as that in which the low energy particle irradiation occurs, in order to minimize contamination and to achieve the total in-situ processing.

In a second mode of operation, low energy particle irradiation occurs slightly prior to (optional) and during metal deposition. In this process, the incident reactive ions, electrons, or photons have the same effect as in the first mode of operation, that is, they modify the surface chemistry of the organic substrate. In order to optimize adhesion in this second mode of operation, the energy beam must combine properly with the metallization beam and for this reason the arrival rates of the low energy particles are comparable (i.e., within one or two orders of magnitude) to the arrival rates of the metal atoms. This is easily accomplished with a controlled ion beam source, an electron beam source, or a photon source. For example, for initial metal deposition rates of 1-100 angstroms/sec, $10^{15}$–$10^{17}$ atoms/$cm^2$- sec. are corresponding particle fluxes.

Accurate control of the low energy particle fluxes in relation to the metal deposition rate for the initial phases of metal deposition is extremely important, as emphasized in the previous paragraph. As a follow-on to an earlier discussion, such control of fluxes cannot be obtained using plasma or glow discharge systems for energy beam impingement of a substrate. Those systems require high pressures of the order of 1 torr., which corresponds to about $10^{21}$ gas atoms/$cm^2$-sec., in order to maintain the discharge. These rates will dominate all other rates in the system. Furthermore, these rates cannot be matched with metal evaporation rates which must be fairly slow during the initial formation of the metal layer on the substrate. Also, metal evaporation cannot be carried out at such high pressures.

Any type of metal can be deposited by sputtering or evaporation in-situ after or during low energy impingement of the organic substrate. In the practice of this invention, the low energy particles are either reactive ions, electrons or photons. The organic substrates include all types of polymer materials, including plastic, epoxies, polyimide, polyesters, Teflon, Mylar, etc.. These organic materials can be layered onto glasses, semiconductors, ceramics, insulators, etc.. Further, the substrate can be made up of laminations of polymer-type materials.

The low energy particles suitable for altering the surface chemistry of the organic substrate in accordance with the present invention include all types of reactive ions, as well as electrons and photons. Suitable examples of reactive ions include O, N, Cl, $CF_4$, $CCl_4$, CO, H, F, S, etc. In general, the low energy particles are those which will react with the material of the substrate to produce chemical changes in the first few hundred angstroms of the substrate.

The adhesion of any metal to the organic substrate is enhanced by the practice of this invention. However, the enhancement of adhesion will vary in degree with the metal and substrate combination that is chosen. For example, the adhesion of Cu on polyimide is significantly enhanced by reactive oxygen or nitrogen treatment of the polyimide, improving adhesion by a factor of 10 or more. In another example, reactive ion treatment of polyimide improves the adhesion of Cr thereto, and also minimizes stress between the Cr and the polyimide. This also aids adhesion and yields a Cr-polyimide structure having a significantly greater peel strength.

It appears that the chemistry of the organic substrate is modified sufficiently that metastable compounds can be formed in the surface of the substrate when the metal atoms impinge on the substrate. These metastable compounds are not those which can be formed by simple heating, as by annealing the substrate. This change in the chemistry of the metal-substrate interface improves adhesion and lessens stress between the deposited metal film and the substrate, perhaps by controlling the microstructure of the metal-substrate interface.

FIG. 1 schematically illustrates a structure which is suitable to practice the present invention. The structure includes a vacuum chamber 10 in which is located an ion source 12 and an evaporant source 14, placed in a holder 16. A substrate holder 18 supports a substrate 20. Output port 22 can be connected to a vacuum pump (not shown) in order to adjust the pressure within chamber 10. Although it is not shown in detail, the ion source would include an input port for providing gasses, such as oxygen and nitrogen, to the ion source. Ion beam sources are well known in the art and a suitable one is a Kaufman-type ion source such as those described in U.S. Pat. No. 4,259,145 and by H. R. Kaufman et al, J. Vac, Sci. Tech. 21 (3), p. 925, Sept./Oct. 1982. This type of source provides a uniform flux of ions over a large area, and can be easily controlled to provide low energy ions having energies in the range of about 50–2000 eV.

In FIG. 1, the dashed lines 24 indicate the ions which are directed to the substrate 20, while the dashed lines 26 indicate the evaporated metal which deposits upon substrate 20.

In practice, the required gasses are introduced through a typical metering system into the ion source 12 at the required flow rate for sustaining a discharge in the ion source. Once the discharge is established, the ion beam is energized at a low energy, 50–2000 eV. These ions are accelerated to the substrate in order to modify its surface chemistry. Either simultaneously with the ion beam or after ion treatment of the substrate, metal can be deposited.

The apparatus of FIG. 1 can be modified slightly if electrons or photons are used to change the surface chemistry of the substrate. Any type of photon source with the proper energy range, such as a laser or a flash lamp, can be used although lasers are preferred. The electron source can be a commercially available source where the electron source is located in the vacuum chamber. Thus, the source 12, in its broadest sense, represents a reactive ion source, a photon source, or an electron source.

Figure 2:
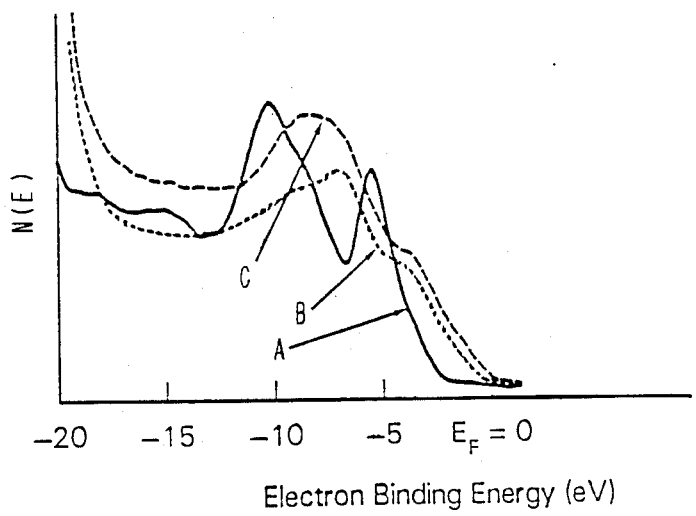
FIG. 2 is a spectrum of a polyimide surface produced by ultraviolet photoemission spectroscopy, which indicates the change in surface chemistry of the polyimide after irradiation by low energy reactive ions in accordance with the present invention.

FIG. 2 illustrates the effect of the low energy particle irradiation on the organic substrate. In this figure, photoemission spectroscopy is used to show the spectrum of photoemitted electrons N(E) as plotted against the electron binding energy (eV). Three different curves A, B, and C are shown. Curve A illustrates the spectrum obtained from a polyimide film which has been annealed, but untreated by reactive ions. Curve B illustrates the change in surface chemistry of the polyimide film when it has been irradiated by reactive oxygen ions. Curve C indicates the effect of post-annealing on the oxygen ion irradiated polyimide, and indicates that the post-annealing step shifts the energy spectrum so that it is more similar to the original spectrum (A).

FIG. 2 indicates the number of electrons N(E) emitted from the polyimide due to the incidence of photons having an energy of 40.8 eV and shows a significanty different spectrum in curve B. This spectrum indicates the change in surface chemistry of a shallow surface layer of the polyimide, indicating that reactive oxygen ion bombardment has altered the surface chemistry of the polymide. It is this alteration of the surface chemistry which leads to increased adhesion and reduced stress in metals deposited on the polyimide.

The following examples will demonstrate the use of low energy reactive ions, electrons or photons to improve metal-substrate adhesion.

EXAMPLE 1

The adhesion between copper films and polyimide was increased by bombarding a polyimide surface with a low energy oxygen or nitrogen ion beam prior to deposition of copper. Adhesion improved by a factor of 10 or more. The deposition and ion treatment were performed in an electron beam evaporator having a Kaufman-type ion beam source installed inside the processing chamber. This allowed in-situ bombardment followed by copper deposition onto the treated polyimide surface, where the substrate always remained within the processing chamber. Nitrogen and oxygen were introduced through a metering system into the ion source at the required flow rate for sustaining a glow discharge. Once the discharge is established the beam is energized at a low energy, in this example at 50–500 eV. The ions were accelerated to the substrate coated with polyimide for a sufficient amount of time to allow thorough treatment of the polyimide. This can range from minutes to a couple of hours. Once the surface was modified, the copper was deposited.

Conventional peel testing was undertaken on a tensile strength tester, yielding the following minimum values:

Adhesion of Cu to polyimide (untreated)—3 gm/mm.

Adhesion of Cu to polyimide ($O_2$ ion treated) $\geq 35$ gm/mm.

Adhesion of Cu to polyimide ($N_2$ ion treated) $\geq 30$ gm/mm.

EXAMPLE 2

Copper was again deposited on polyimide. The polyimide was spun onto an aluminum-covered silicon wafer. Reactive nitrogen and oxygen ion bombardment was carried out in-situ prior to the copper deposition using a standard sputter ion gun at 250 eV in an oxygen or nitrogen partial pressure of $2-3 \times 10^{-4}$ torr.. The ion beam current density was of the order of a microamp/$cm^2$ for one hour. After this treatment, a copper layer 8 microns thick was deposited onto the treated polyimide surface.

Surface analysis prior to copper deposition showed that the reactive ion bombardment changed the composition of the polyimide surface. X-ray photoemission spectroscopy revealed that nitrogen or oxygen incorporated into the polyimide by ion bombardment was in a different chemical state than the corresponding atomic species already present in the untreated polyimide. Ultraviolet photoemission spectroscopy also showed valence state chemical bonding changes. These observations, as well as the absence of adhesion improvement for inert gas ion (Ar) bombardment, demonstrated that the enhanced adhesion is a result of chemical activation of the polyimide surface.

EXAMPLE 3

The following table shows the results of various pretreatment steps in the preparation of the polyimide or Kapton[198] substrates. All pretreatment steps occurred at room temperature. At higher temperatures, the adhesion increased. From the table, it is apparent that oxygen ion and nitrogen ion pretreatments of polyimide significantly improve the adhesion, while other pretreatment steps, such as argon ion bombardment and KOH etching, do not significantly improve adhesion.

TABLE

| Sample | Pretreatment | Composition C : N : O | Adhesion Strength gms/mm | |
|---|---|---|---|---|
| 1 | As prepared | 8.2:1.0:1.7 | None | |
| 2 | Argon-sputtering | 19.2:1.0:0.9 | None | |
| 3 | KOH-Etching | 23.2:1.0:6.6 | 0.211 | 0.238 |
| 4 | O-Sputtering | 9.3:1.0:1.2 | 1.27 | 1.41 |
| 5 | N-Sputtering | 5.3:1.0:0.6 | 1.63 | 1.09 |
| 6 | Evap. on Kapton | 9.3:1.0:4.4 | 4.57 | 2.88 |

In the practice of this invention, low energy reactive ions, electrons, and photons are used to alter the surface chemistry of a thin layer of an organic substrate in order to promote increased adhesion between the substrate and a metal layer deposited thereon. It is important that the energy of the incident particles (reactive ions, electrons, and photons) be less than about 2000 eV, and that the incident particles are those which will alter the surface chemistry of a thin surface region of the substrate. This chemistry is altered to a depth of approximately 300 angstroms or less. Still further, if the particle treatment occurs simultaneously with the metal deposition, the arrival rates of the metal atoms and the reactive ions, electrons, or photons must be within about one or two orders or magnitude of each other so that maximum chemistry alteration and mixing can occur at the metal-substrate interface. Until a continuous film of metal is established on the surface of the substrate, metal atom arrival rates are chosen to be less than about 100 angstroms/sec..

While the invention has been described with respect to particular embodiments thereof, it will be apparent to those of skill in the art that variations exist without departing from the spirit and scope of the present invention.

Having thus described our invention, what we claim as new and desire to secure as Letters Patent is:

1. A method for improving metal adhesion to an organic substrate, including the steps of:
    irradiating a surface of said substrate with low energy particles, said particles being selected from the group consisting of reactive ions, electrons and photons, wherein said reactive ions and electrons have energies in the range of about 50–2000 eV and said photons have energies in the range of about 0.2–500 eV, said particles being incident on said surface with a particle flux of about $10^{15}$–$10^{17}$ particles/cm$^2$-sec.;
    depositing a metal film onto said substrate simultaneously with said irradiation by low energy particles, said metal film being deposited from the vapor phase at an initial rate of deposition of approximately 1–100 angstroms per second, and
    continuing said metal deposition until the desired thickness of metal is obtained on said substrate.

2. The method of claim 1, where said metal is deposited by evaporation or sputtering.

3. The method of claim 1, where said metal is deposited at room temperature.

4. The method of claim 1, where said metal is deposited at a temperature greater than room temperature but less than the curing temperature of said substrate.

5. The method of claim 1, where said substrate is a polymer.

6. The method of claim 5, where said substrate is selected from the group consisting of polyimide, polyesters, Mylar, Teflon, plastics, and epoxies.

7. The method of claim 5, where said substrate is polyimide.

8. The method of claim 1, where the rates of arrival at said substrate surface of said low energy particles and atoms of said metal are comparable to one another within approximately two orders of magnitude.

9. The method of claim 1, where said metal is selected from the group consisting of Ni, Cu, Ti, Al, Cr, Mo, W, Rh, Pt, and Pd.

10. A method for enhancing the adhesion of copper to polymers comprising the steps of:
    irradiating a polymer with a beam of low energy particles having a particle flux less than about $10^{17}$ particles/cm$^2$ sec. selected from the group consisting of reactive ions, electrons and photons, said reactive ions and electrons having energies in the range of about 50–2000 eV, said photons having energies in the range of about 0.2–500 eV,
    depositing copper from the vapor phase onto said irradiated surface of said polymer at a rate which is sufficiently slow to enhance adhesion of copper atoms to said polymer to a depth of up to approximately a few hundred angstroms into said polymer, said rate of deposition of copper initially being approximately 1–100 angstroms per second,
    said copper depositing step and said irradiating step occurring simultaneously at least until a continuous copper film is formed on said polymer.

11. The method of claim 10, where the rates of arrival at said substrate of said copper and said particles are comparable to one another within approximately two orders of magnitude.

12. The method of claim 11, where the temperature of said polymer surface is less than about 360° C.

13. The method of claim 11, where said reactive ions are selected from the group consisting of oxygen and nitrogen.

14. The method of claim 10, where the temperature of said polymer is less than about 60% of its glass transition temperature during said simultaneous copper deposition and particle irradiation.

15. The method of claim 10, where said polymer is polymide.

* * * * *